(12) United States Patent
Parker et al.

(10) Patent No.: US 10,971,880 B2
(45) Date of Patent: Apr. 6, 2021

(54) CONNECTION FOR PRINTED CIRCUIT BOARD ASSEMBLIES

(71) Applicant: Neptune Technology Group Inc., Tallassee, AL (US)

(72) Inventors: Wilson Philip Parker, Andalusia, AL (US); Jeffrey Keith Dorris, Wetumpka, AL (US); Frederick Guhl Papenburg, Jr., Opelika, AL (US)

(73) Assignee: NEPTUNE TECHNOLOGY GROUP INC., Tallassee, AL (US)

( * ) Notice: Subject to any disclaimer, the term of this patent is extended or adjusted under 35 U.S.C. 154(b) by 449 days.

(21) Appl. No.: 15/858,985

(22) Filed: Dec. 29, 2017

(65) Prior Publication Data

US 2018/0123304 A1    May 3, 2018

Related U.S. Application Data

(63) Continuation of application No. PCT/US2017/058343, filed on Oct. 25, 2017.
(Continued)

(51) Int. Cl.
*H05K 3/30* (2006.01)
*H01R 43/20* (2006.01)
(Continued)

(52) U.S. Cl.
CPC ....... *H01R 43/205* (2013.01); *H01R 43/0256* (2013.01); *H05K 3/34* (2013.01); *H05K 3/36* (2013.01); *H05K 3/366* (2013.01); *H05K 3/40* (2013.01); *H05K 2201/09027* (2013.01); *H05K 2201/09063* (2013.01); *H05K 2203/302* (2013.01)

(58) Field of Classification Search
CPC .. H01R 43/205; H01R 43/0256; H05K 3/366; H05K 3/34; H05K 3/36; H05K 3/40; H05K 2201/09027; H05K 2201/09063; H05K 2203/302; Y10T 29/49128; Y10T 29/4913; Y10T 29/49144; Y10T 29/49139
USPC ................ 29/831, 832, 834, 840, 837
See application file for complete search history.

(56) References Cited

U.S. PATENT DOCUMENTS 5,049,089 A * 9/1991 Koenig ................. H05K 3/363
                                                                          439/493
7,379,021 B2 * 5/2008 Lee ........................ H01Q 1/243
                                                                          439/59
(Continued)

FOREIGN PATENT DOCUMENTS

JP    2001-217517 A    8/2001

OTHER PUBLICATIONS

International Search Report and Written Opinion issued for the corresponding PCT Application No. PCT/US2017/058343, dated Jan. 29, 2018, 15 pages.

*Primary Examiner* — Donghai D Nguyen
(74) *Attorney, Agent, or Firm* — Snyder, Clark, Lesch & Chung, LLP

(57) ABSTRACT

A printed circuit board assembly is provided. The assembly has a substantially rigid member, the substantially rigid member having a first protrusion, a support member with a first slot that accepts the protrusion in such a way to produce flex in at least one of the rigid member and the support member. The flex exerts compression on the protrusion that prevents it from disengaging the slot.

15 Claims, 10 Drawing Sheets

Related U.S. Application Data

(60) Provisional application No. 62/413,294, filed on Oct. 26, 2016.

(51) Int. Cl.
    *H01R 43/02*     (2006.01)
    *H05K 3/34*     (2006.01)
    *H05K 3/36*     (2006.01)
    *H05K 3/40*     (2006.01)

(56) References Cited

U.S. PATENT DOCUMENTS

| | | |
|---|---|---|
| 2003/0107876 A1 | 6/2003 | Suzuki |
| 2005/0042941 A1 | 2/2005 | Keating et al. |
| 2007/0096995 A1 | 5/2007 | Lee |
| 2009/0046437 A1* | 2/2009 | Hsieh .................... G06F 1/185 |
| | | 361/752 |
| 2013/0078825 A1 | 3/2013 | Wain |

* cited by examiner

CONNECTION FOR PRINTED CIRCUIT BOARD ASSEMBLIES

CROSS-REFERENCE TO RELATED APPLICATIONS

This application is a continuation of International patent application number PCT/US17/58343, filed Oct. 25, 2017, (currently pending). International patent application number PCT/US17/58343 cites the priority of U.S. Application No. 62/413,294, filed 26 Oct. 2016. The foregoing applications are incorporated herein by reference in their entireties.

TECHNICAL FIELD

The field of the present disclosure generally related to printed circuit board assemblies and connections between printed circuit boards and related components.

BACKGROUND

Many electronic devices use one or more printed circuit boards. These printed circuit boards can support and electrically connect various electronic components in a device, such as capacitors, resistors, processors, and other circuit boards. The components are ordinarily connected along one or more conductive paths, which may be found on the inner or outer layer of the printed circuit board. Printed circuit boards offer numerous advantages over other forms of electrical connections based on their ease of manufacturing, their elimination of human error in wiring, and their ease of assembling a completed circuit.

A printed circuit board is often part of a printed circuit board assembly, where it is connected, both mechanically and electrically, to one or more other printed circuit boards or other electronic components. In a conventional connection for a printed circuit board assembly, the boards are joined together at right angles. The first board traditionally has two or more through-holes located on its planar surface, and the second board traditionally has two or more protrusions along one of its edges. The protrusions are configured in alignment with the through-holes and have a shape complementary to the through-holes. The boards are connected by inserting the protrusions into the through-holes and applying solder to either side of the connections. The solder provides mechanical stability to the boards by maintaining them in a perpendicular orientation to each other, and it also facilitates an electrical connection between the boards. Although frequently used, this type of connection for a printed circuit board assembly has a number of disadvantages: it can be slow and tedious to complete the connections with solder, and the necessary precision can be difficult for the manufacturing process. In addition, a board cannot be easily replaced in an assembly, as it requires removing the solder on the current board and re-soldering a new board, which may require special training.

Variations of this type of connection may also be used in a printed circuit board assembly. For instance, one type of connection may use through-holes and protrusions but also one or more fasteners, such as screws, instead of or in addition to solder to maintain the connection of the boards. This type of connection may allow for easier replacement of a board in an assembly, but the connection can still be slow and tedious to install, and it may require special tools depending on the configuration and location of the boards in the assembly. A first printed circuit board may also be connected at a right angle to a second printed circuit board through the use of a female connector installed on the planar surface of the second board. A male connector may be installed on the first board, or the edge of the first board may be configured to insert into the female connector. In this type of connection, the female connector may supply a compressive force to hold the second board in place, or a fastener like a screw may be used to maintain the mechanical and electrical connection of the boards. Although this type of assembly may be easier to install and not require special tools, boards manufactured with this type of connector are more expensive because they require special parts, and the installation of the connector on the second board may be difficult and slow to manufacture.

Consequently, there is a need in the art for a printed circuit board assembly with a mechanical and electrical connection that is inexpensive, quick, and easy to install; allows for ready replacement of printed circuit boards; and does not require special tools or parts to complete the connection.

SUMMARY

The problems described above are addressed by embodiments of a novel circuit board assembly disclosed herein. The circuit board assembly comprises at least one circuit board connected to another structure (such as a second circuit board) by at least one protrusion that is aligned with a corresponding slot, such that seating the protrusion in the slot causes parts of the assembly to flex. The flex causes compression forces within the assembly that maintain the parts in an assembled configuration. The compression forces reduce the need for fasteners, solder, adhesive, and other means to maintain the assembly.

In a first aspect, the circuit board assembly comprises a substantially rigid member, the substantially rigid member having a first protrusion, a second protrusion, and a third protrusion; and a support member, the support member having a first slot, a second slot, and a third slot, wherein the slots are configured so that the first slot is aligned with the first protrusion, the second slot is aligned with the second protrusion, and the third slot is offset from the third protrusion in a direction perpendicular to the curve formed by the first, second, and third protrusion; wherein at least one of the substantially rigid member and the support member is a printed circuit board, and wherein the substantially rigid member experiences flex when the protrusions are inserted into the slots.

In a second aspect, the printed circuit board assembly comprises a substantially rigid member, the substantially rigid member having a first protrusion; a support member, the support member having a first slot, the first slot having a shape complementary to the shape of the first protrusion; and a fastener connecting the substantially rigid member to the support member; wherein at least one of the substantially rigid member and the support member is a printed circuit board, and wherein the substantially rigid member experiences flex when the fastener is secured and the first protrusion is inserted into the first slot.

In a third aspect, the printed circuit board assembly comprises a substantially rigid member, the substantially rigid member having a contact edge, the contact edge having a first side with a first contact point and a second contact point and a second side with a third contact point; and a support member, the support member having a first protrusion, a second protrusion, and a third protrusion, wherein the protrusions are configured to substantially coincide with the contour of the contact edge; wherein at least one of the substantially rigid member and the support member is a printed circuit board, and wherein the substantially rigid member experiences flex when the contact edge is inserted between the protrusions such that the first protrusion contacts the first contact point, the second protrusion contacts the second contact point, and the third protrusion contacts the third contact point.

A fourth aspect is a method for assembling a printed circuit board assembly, the method comprising providing a printed circuit board assembly of the first or second aspect; flexing the substantially rigid member to align each protrusion with each respective slot; and inserting each protrusion into each respective slot.

A fifth aspect is another method of assembling a printed circuit board assembly, the method comprising providing the printed circuit board assembly of the third aspect; flexing the substantially rigid member; and inserting the contact edge between the protrusions.

The above presents a simplified summary in order to provide a basic understanding of some aspects of the claimed subject matter. This summary is not an extensive overview. It is not intended to identify key or critical elements or to delineate the scope of the claimed subject matter. Its sole purpose is to present some concepts in a simplified form as a prelude to the more detailed description that is presented later.

DEFINITIONS

Figure 1:
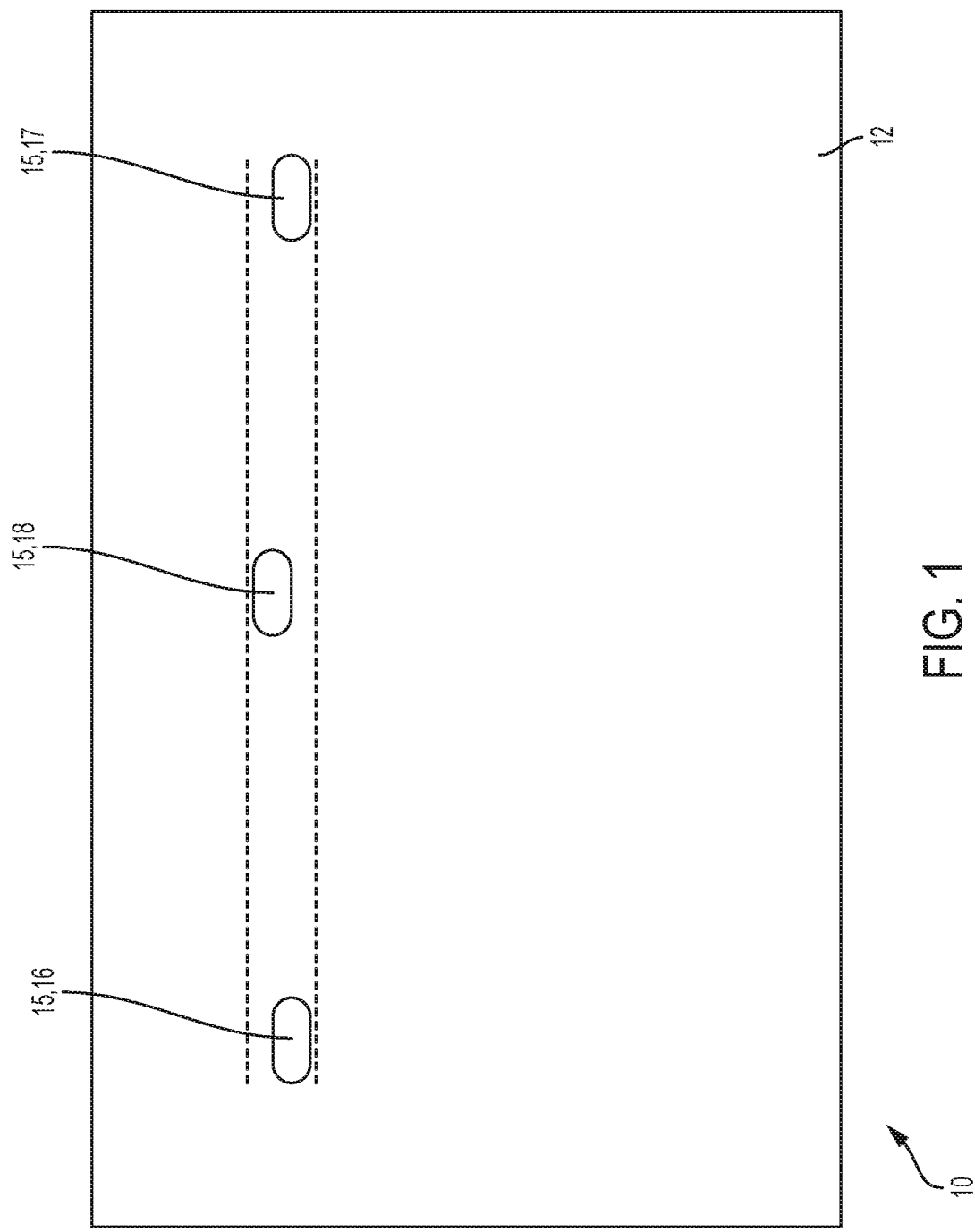
FIG. 1: A top view of an embodiment of the support member having three slots, wherein one of the slots is offset in a direction perpendicular to the curve formed by the three protrusions shown in FIG. 2.

Unless otherwise defined, all terms (including technical and scientific terms) used herein have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly so defined herein. Well-known functions or constructions may not be described in detail for brevity or clarity.

The terminology used herein is for the purpose of describing particular embodiments only and is not intended to be limiting. As used herein, the singular forms "a", "an," and "the" are intended to include the plural forms as well, unless the context clearly indicates otherwise.

The terms "first," "second," and the like are used herein to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present disclosure.

With reference to the use of the word(s) "comprise" or "comprises" or "comprising" in the foregoing description and/or in the following claims, unless the context requires otherwise, those words are used on the basis and clear understanding that they are to be interpreted inclusively, rather than exclusively, and that each of those words is to be so interpreted in construing the foregoing description and the following claims.

Unless stated otherwise, the term "consisting essentially of" means that, in addition to the recited elements, what is claimed may also contain other elements (steps, structures, ingredients, components, etc.) that do not adversely affect the operability of what is claimed for the intended purpose stated in this disclosure. This term excludes such other elements that adversely affect the operability of what is claimed for its intended purpose as stated in this disclosure, even if such other elements might enhance the operability of what is claimed for some other purpose.

The terms "about" or "approximately" mean within a range of reasonable error around a central value. Such reasonable error may for example stem from the precision of an instrument or method used to measure the value. The error could also stem from the precision of a method of making a structure. For example, in some contexts these terms may mean+/−5%. In others these terms may mean±10%. In still others these terms may mean±20%.

The term "flex" means the bending of a slender structure, which occurs when an external load is applied perpendicular to the longitudinal axis of the structure. For example, a sheet of metal experiences flex when a force is applied against the flat surface of the metal.

The term "creep" refers to permanent deformation in a structure that occurs as a result of an external load applied to the structure.

DETAILED DESCRIPTION

An improved connection for printed circuit board assemblies has been developed. The improved connection provides for the connection of at least one printed circuit board to another member, which may be another printed circuit board. Advantageously, in some embodiments where the assembly comprises two printed circuit boards, the connection provides a mechanical connection and one or more electrical connections between the boards. When used to connect two printed circuit boards in this way, certain embodiments of an assembly with this new connection are inexpensive, quick, and easy to install; allow for simple replacement of a component in the assembly; and do not require any special tools or parts to complete the connection.

The printed circuit board assembly comprises a support member 10 connected to a substantially rigid member 20. The support member 10 may be any suitable shape with a surface 12 to support the substantially rigid member 20. The support member 10 may be constructed from any material with sufficient rigidity to support the substantially rigid member 20. In some embodiments, the support member 10 is a printed circuit board, but in other embodiments, the support member 10 may be a frame or a case or another structure with a flat surface. The support member 10 may be constructed from fiberglass, as in the case of a printed circuit board, or the support member 10 may be constructed from a metal alloy, plastic, or a similar material. Alternatively, the support member 10 may have a non-flat surface to support the substantially rigid member 20 so long as an edge of the substantially rigid member 20 complements the contour of the non-flat surface.

The substantially rigid member 20 is a structure that can flex without creep along one of its axes. The substantially rigid member 20 is ordinarily a shell, meaning that the thickness is significantly less than the length and height. In some embodiments, the front and back surfaces of the substantially rigid member 20 are flat, and the other sides are narrow based on the thinness of the substantially rigid member. A traditional printed circuit board is an example of such a shape. Alternatively, in other embodiments, the substantially rigid member 20 may be a hollow cylinder or other curved shape with relatively small thickness. The substantially rigid member 20 may be constructed from any material that allows for flex without creep. In some embodiments, such as those where the substantially rigid member 20 is a printed circuit board, the substantially rigid member 20 is constructed from fiberglass, which may have a metallic coating. Alternatively, the substantially rigid member 20 may be constructed from a metal alloy, plastic, plastic with imprinted metal, or any other suitable material.

At least one of the support member 10 and the substantially rigid member 20 is a printed circuit board. In embodiments of the printed circuit board assembly with only one printed circuit board, the printed circuit board could be connected to various other components. For instance, the printed circuit board could be connected to a frame, housing, or chassis for the printed circuit board assembly. In other embodiments, the printed circuit board is connected to another component of an electrical circuit, such as an antenna, or some other fixture. In other embodiments, both members are a printed circuit board. Printed circuit boards generally have at least one conductive path 90 that connects electrical components in the circuit. In embodiments where both members 10, 20 are a printed circuit board, the connection between the boards may electrically connect one or more conductive paths 90 on the support member 10 to one or more conductive paths 90 on the substantially rigid member 20.

The printed circuit board assembly comprises a substantially rigid member 20 connected to a support member 10 by protrusions 25 inserted into slots 15. The substantially rigid member 20 comprises a plurality of protrusions 25 located on an edge 22, and the support member 10 comprises a plurality of slots 15 located on its support surface 12. The slots 15 can have any suitable shape, including rectangular, circular, or "D" shaped. The protrusions 25 are dimensioned so that they can fit in the slots 15, and in some embodiments, the protrusions 25 have a shape that is similar to the shape of the slots 15. The protrusions 25 may be long enough that the protrusions 25 extend beyond the bottom surface 14 of the support member 10 when the protrusions 25 are inserted into the slots 15, or the protrusions 25 may not extend beyond the bottom surface 14. The slots 15 are configured on the support member 10 so that all of the protrusions 25 can be inserted into the slots 15 only after the substantially rigid member 20 is flexed to align the protrusions 25 with the slots 15.

Figure 2:
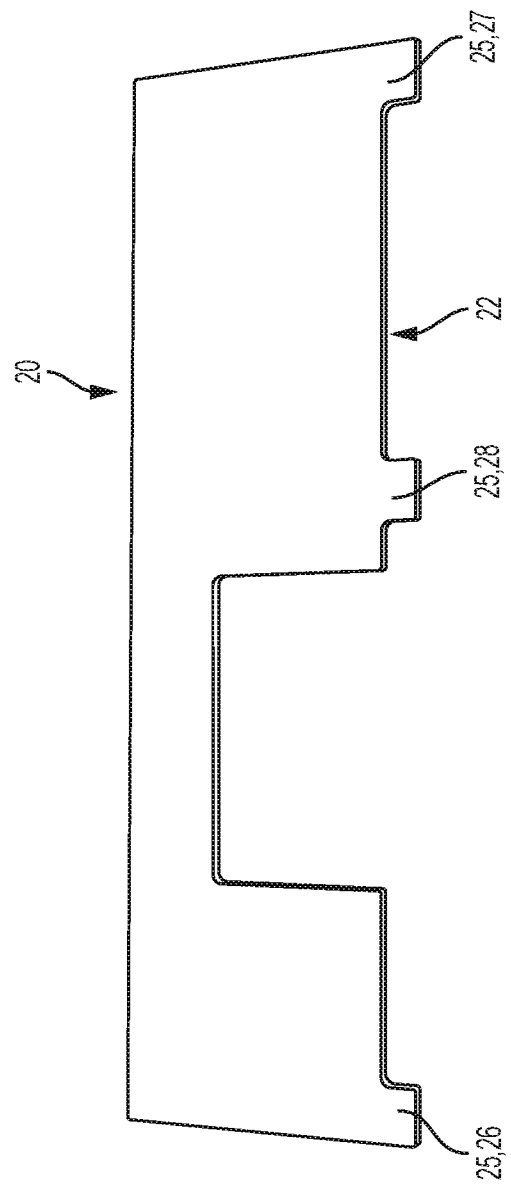
FIG. 2: An elevational view of an embodiment of the substantially rigid member having three protrusions.
Figure 8:
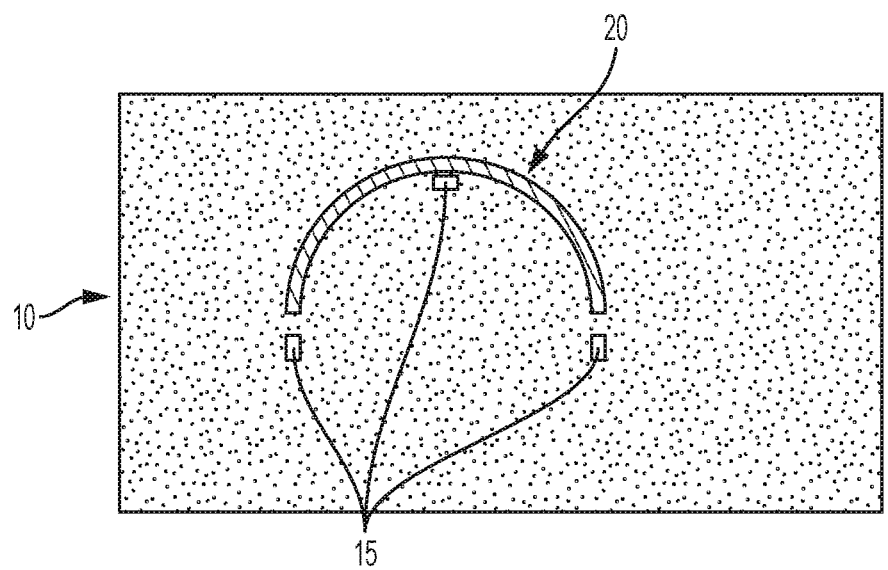
FIG. 8: A top view of an embodiment of a disconnected printed circuit board assembly wherein the substantially rigid member is semicircular and the support member has slots in a semicircular configuration with one slot offset perpendicular to the curve of the protrusions of the substantially rigid member.

In some embodiments, the substantially rigid member 20 comprises a first protrusion 26, a second protrusion 27, and a third protrusion 28; and the support member comprises a first slot 16, a second slot 17, and a third slot 18. The slots 15 are configured so that, when the first and second slots 16, 17 are aligned with the first and second protrusions 26, 27, respectively, the third slot 18 is offset from the third protrusion 28 in a direction perpendicular to a curve formed by the first, second, and third protrusions 26, 27, 28. In embodiments where the substantially rigid member 20 is a flat board, the curve is a straight line corresponding to the board's straight edge with the protrusions 25. An example of this embodiment is shown in FIGS. 1 and 2. The dashed lines in FIG. 1 show how the middle slot 18 is offset from the center of the other two slots 16, 17. Although FIG. 1 shows the middle slot 18 as offset, it is to be understood that any of the slots 15 may be the offset slot. In other embodiments, however, where the edge 22 of the substantially rigid member 20 is not straight, the curve is not a straight line. For instance when the substantially rigid member 20 is circular or semicircular, the curve is arced. An example of this embodiment is show in FIG. 8. In any of the foregoing embodiments, because the third slot 18 is offset, the substantially rigid member 20 must be flexed to insert all three protrusions 25 into all three slots 15.

Figure 3:
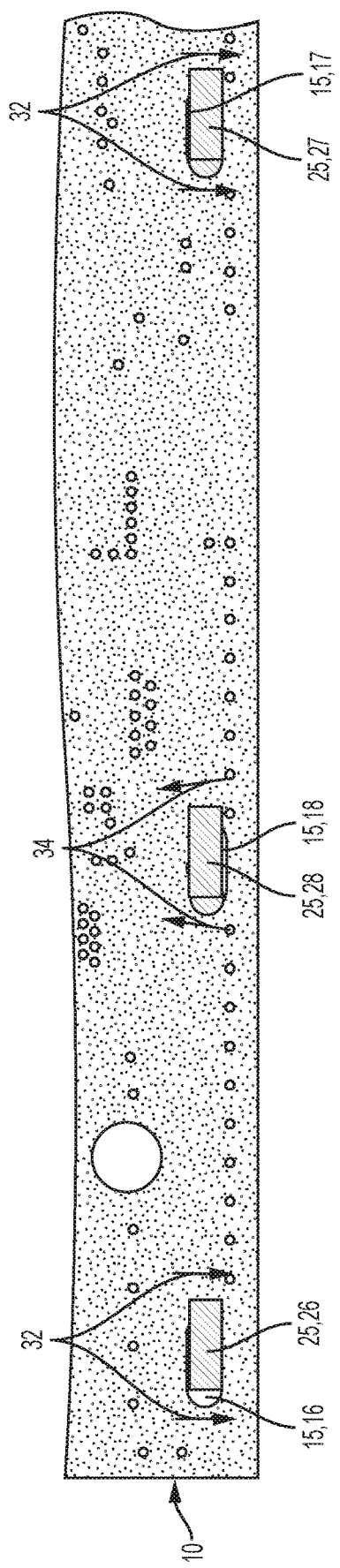
FIG. 3: A bottom view of an embodiment of a printed circuit board assembly where the protrusions are inserted into the slots, the arrows indicating the force that the slots apply to the protrusions, resulting in flex of the substantially rigid member.

The substantially rigid member 20 remains flexed after the protrusions 25 are inserted into the slots 15, which, when the support surface 12 is horizontal, allows the substantially rigid member 20 to remain upright and resist disconnection. The substantially rigid member 20 remains flexed because the surfaces of the slots 15 apply opposing forces to the protrusions. As illustrated in FIG. 3, two of the slots 16, 17 apply force in approximately the same direction 32, and the third slot 18 applies force in approximately the opposite direction 34. The opposing forces 32, 34 on the protrusions 25 maintain the substantially rigid member 20 in an upright position. In many embodiments, the upright position is a 90° angle relative to the support member 10, but in some embodiments the substantially rigid member 20 could be upright at angle less than 90° relative to the support member 10 if the slots are dimensioned and cut at an angle that supports the substantially rigid member 20 in such a position. For instance, the substantially rigid member 20 may be in the upright position when it is at a 45° angle relative to the support member 10. The opposing forces 32, 34 also increase the friction between the surfaces of the protrusions 25 and the surfaces of the slots 15. As a result of the increased friction, the substantially rigid member 20 resists disconnection from the support member 10 (i.e. withdrawal of the protrusions 25 from the slots 15).

Figure 6:
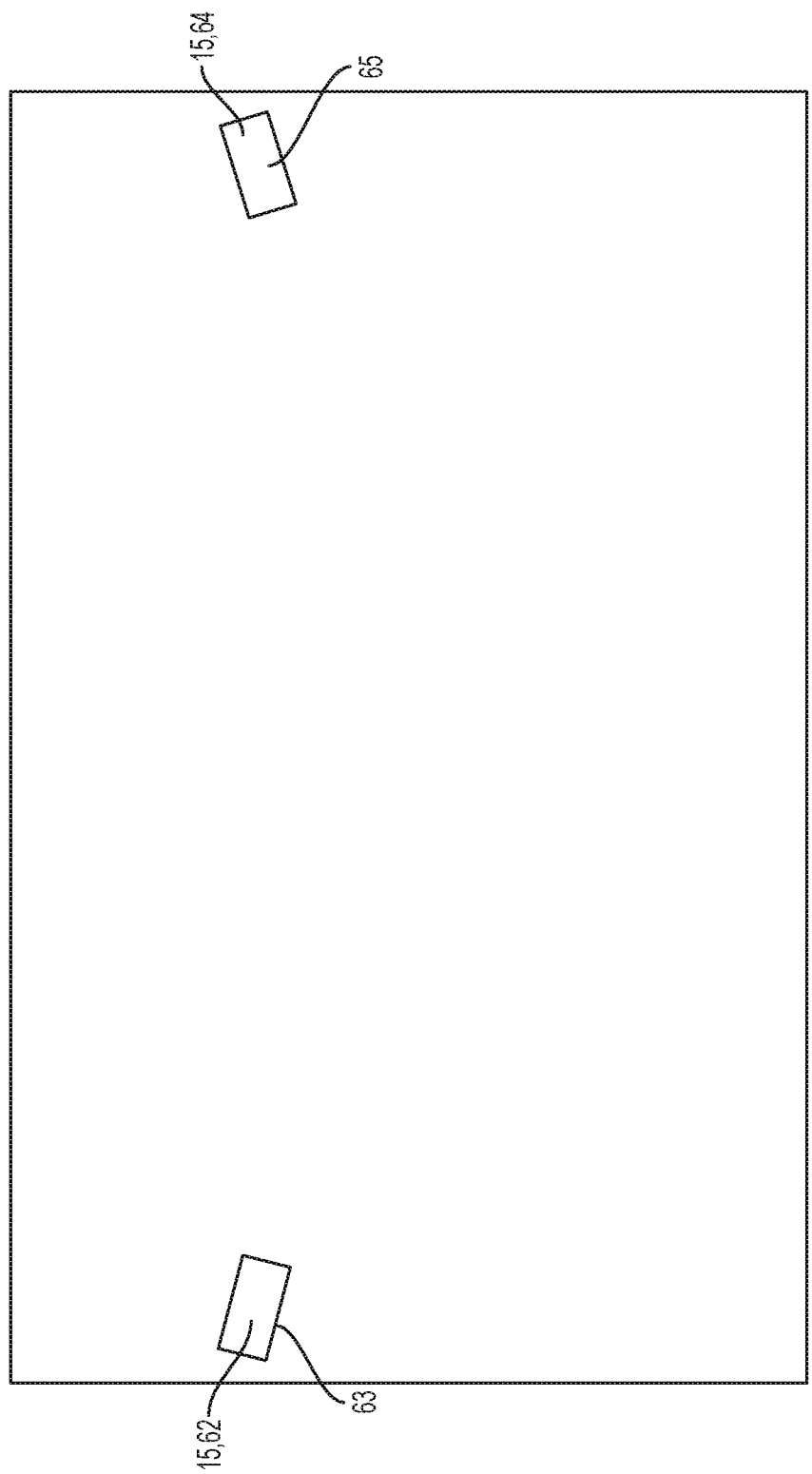
FIG. 6: A top view of an embodiment of a support member having two slots, wherein the second slot is rotationally offset.

In other embodiments, the substantially rigid member 20 comprises a first protrusion 76 and a second protrusion 77, and the support member 10 comprises a first slot 62 and a second slot 64. Each slot 62, 64 has a protrusion-contacting surface 63, 65, and each protrusion 76, 77 has a slot-contacting surface wherein the shape of the slot-contacting surface is complementary to the shape of the protrusion-contacting surface 63, 65. The slots 62, 64 are configured so that, when the first slot 62 is aligned with the first protrusion 76, the protrusion-contacting surface 65 of the second slot 64 has an orientation that is rotated less than 90° (but greater than 0°) relative to the orientation of the slot-contacting surface of the second protrusion 77. FIG. 6 shows an example how the slots 62, 64 are configured on a support member 10 according to this embodiment. Because the protrusion-contacting surface 65 of the second slot 64 is rotationally offset from the orientation of the slot-contacting surface of the second protrusion 77, the substantially rigid member 20 must be flexed to align the second protrusion 77 with the second slot 64 to connect the members.

Figure 7:
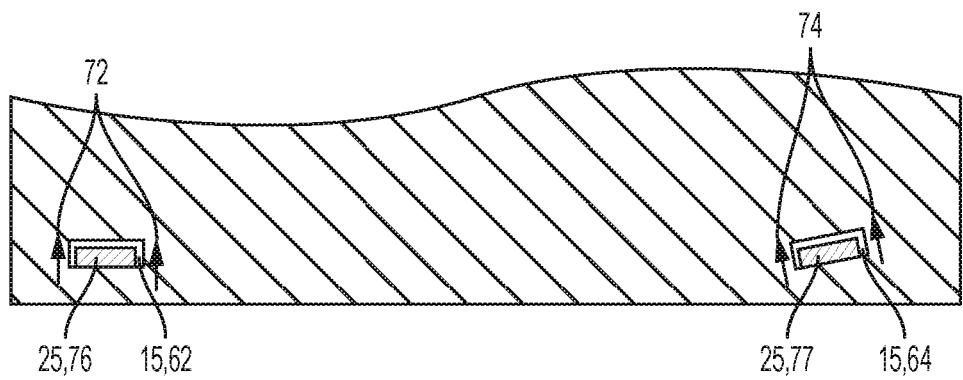
FIG. 7: A bottom view of an embodiment of a printed circuit board assembly where the support member has two slots and the substantially rigid member has two protrusions, the arrows indicated the force that the slots apply to the protrusions, resulting in flex of the substantially rigid member.

Similar to the previous embodiment, the substantially rigid member 20 remains flexed after the protrusions 76, 77 are inserted into the slots 62, 64, which allows the substantially rigid member 20 to remain upright when the support surface 12 is horizontal and to resist disconnection. As shown in FIG. 7, each slot 62, 64 applies a force 72, 74 against the protrusions 76, 77 in a different direction. The differing forces 72, 74 maintain the substantially rigid member 20 in an upright position, and the forces 72, 74 also increase the friction between the surfaces of the slots 62, 64 and the surfaces of the protrusions 76, 77, which prevents disconnection of the substantially rigid member 20 from the support member 10. The upright position may be a 90° angle or less than 90° relative to the support member 10.

Figure 9:
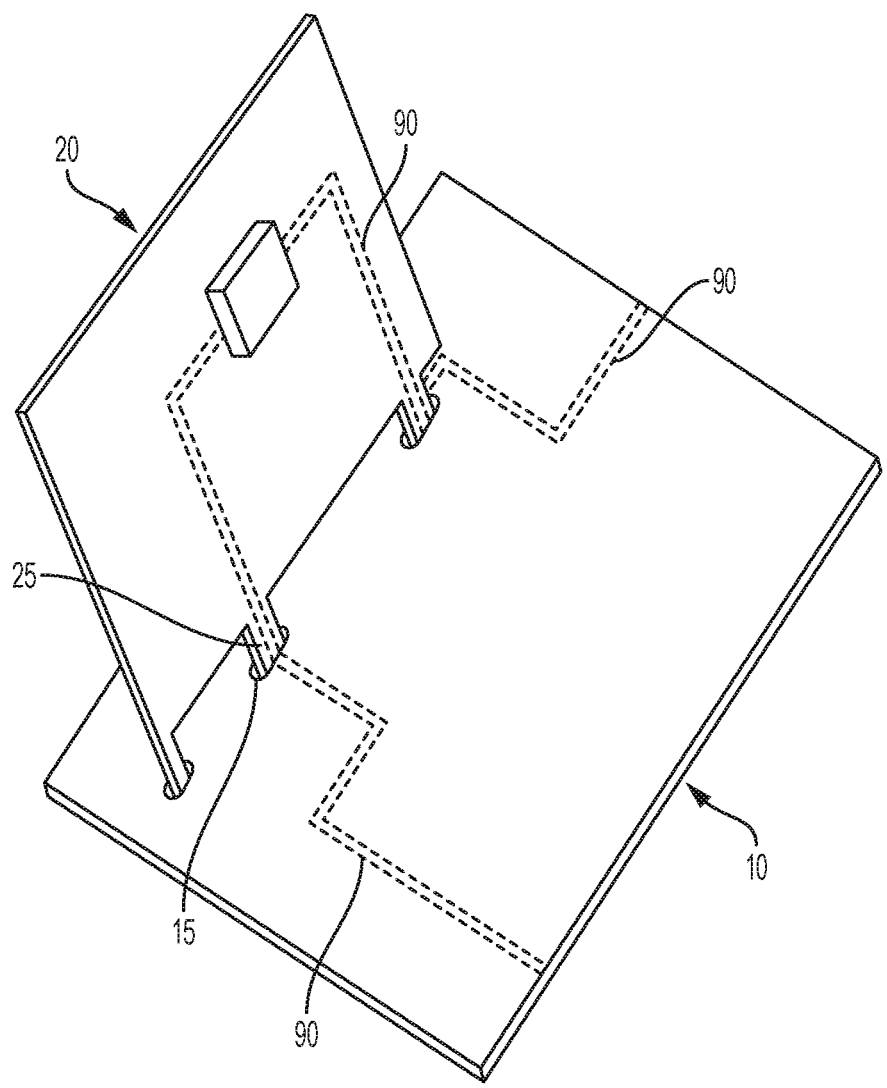
FIG. 9: A perspective view of an embodiment of a printed circuit board assembly comprising two printed circuit boards, one of the printed circuit boards having a component installed thereon, wherein at least one protrusion inserted into a slot electrically connects at least one electrical path on the support member to at least one electrical path on the substantially rigid member.

Optionally, in embodiments where the substantially rigid member 20 and the support member 10 are either a printed circuit board or another electrical component like an antenna, at least one pair of protrusions 25 and slots 15 may electrically connect the members 10, 20. In this embodiment, at least one conductive path 90 on the substantially rigid member 20 is connected to a protrusion 25, and the surface of the protrusion 25 that contacts the corresponding slot 15 is a conductive or semi-conductive material. Similarly, on the support member 10, at least one conductive path 90 is connected to the corresponding slot 15, and the surface of the slot 15 that contacts the protrusion 25 is a conductive or semi-conductive material. As shown in FIG. 9, components may be installed on either member 10, 20 and located along the conductive path 90. In some embodiments, the surface of a protrusion 25 or a slot 15 may be plated with metal to facilitate the electrical connection. After the substantially rigid member 20 is connected to the support member 10 by inserting each protrusion 25 into the corresponding slot 15, the electrical connection between the boards is maintained by the opposing forces on the protrusions 25 due to the flex of the substantially rigid member 20. For a protrusion 25 with an electrical connection, the force that the slot 15 applies against the protrusion 25 causes the conductive or semi-conductive material on the protrusion 25 to maintain contact with the conductive or semi-conductive material on the slot 15. In some embodiments, more than one protrusion 25 electrically connects to a slot 15, and in some of those embodiments, all protrusions 25 electrically connect to a slot 15.

In some embodiments, the printed circuit board assembly does not have any other type of fastener that connects the substantially rigid member 20 to the support member 10. This simple connection has the advantage of allowing the printed circuit board assembly to be quickly and easily installed. Alternatively, the printed circuit board assembly may include one or more fasteners to connect the substantially rigid member 20 to the support member 10. In some embodiments, the additional fastener may be solder, which may enhance both the mechanical and electrical connection between the members 10, 20. For instance, solder may be applied around the protrusions 25 to secure the connection to the slots 15. In other embodiments, a mechanical fastener, such as a screw, may be used, and optionally, it may replace one of the pairs of protrusions and slots.

Figure 4:
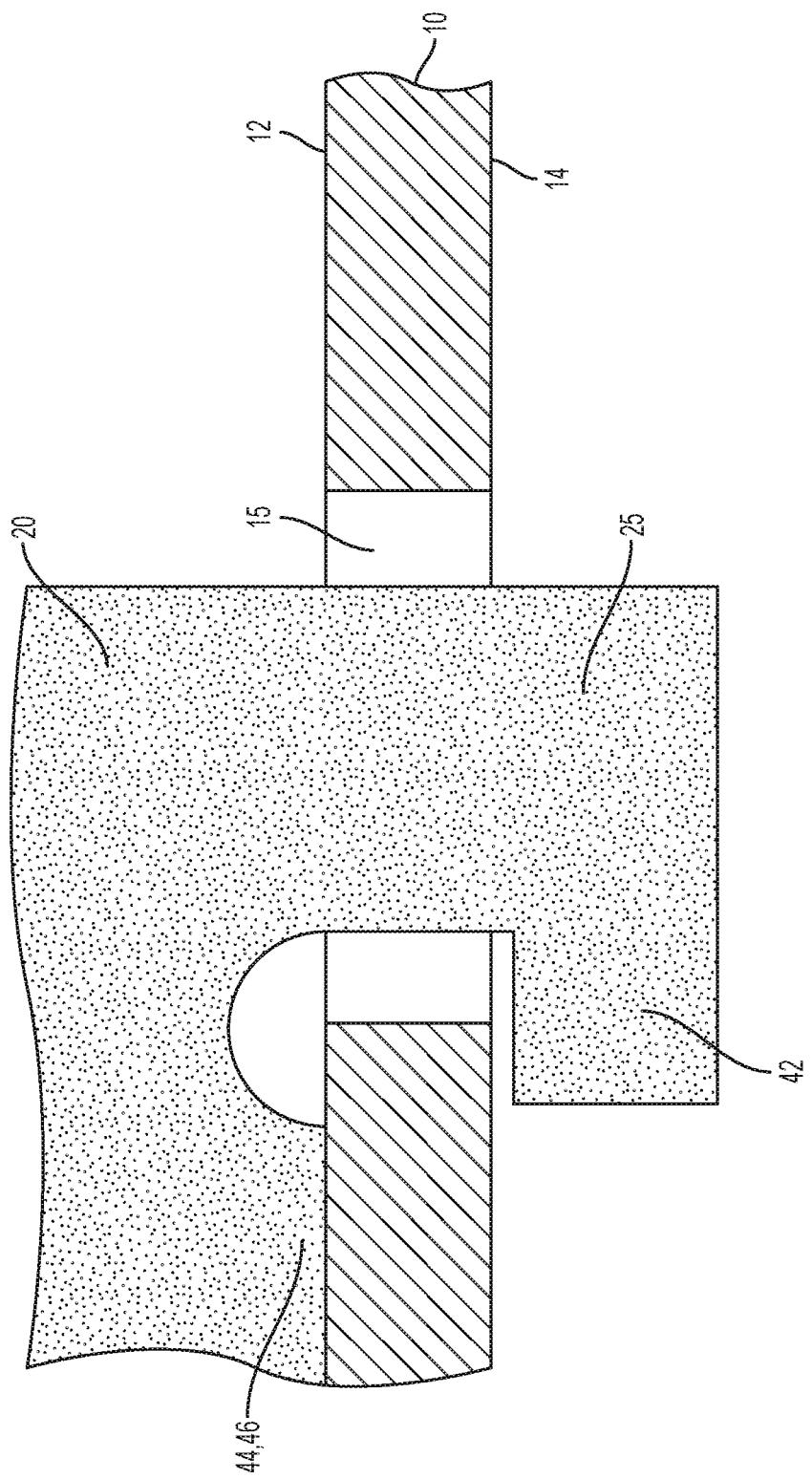
FIG. 4: A cutaway, enhanced elevational view of an embodiment of a printed circuit board assembly, wherein the substantially rigid member has a protrusion comprising a lower jut.

To prevent disconnection of the printed circuit board assembly, at least one protrusion 25 may optionally have a lower jut 42. The lower jut 42 may comprise any suitable shape in which a lower portion of the protrusion 25 extends further outward in at least one direction than an upper portion of the protrusion 25. An example of a lower jut is depicted in FIG. 4. The protrusion 25, including the lower jut 42, is dimensioned so that the protrusion 25 may be inserted into the slot 15 so that the lower jut 42 is below the bottom surface 14 of the support member 10. After the protrusion 25 is fully inserted, the substantially rigid member 20 is slid until the lower jut 42 overlaps the bottom surface 14 of the support member 10. Thus, unless the substantially rigid member 20 is slid back to align the lower jut 42 with the slot 15, the substantially rigid member 20 resists disconnection from the support member 10 because the lower jut 42 contacts the bottom surface 14 of the support member 10 when a force is applied to separate the substantially rigid member 20 from the support member 10.

Figure 5:
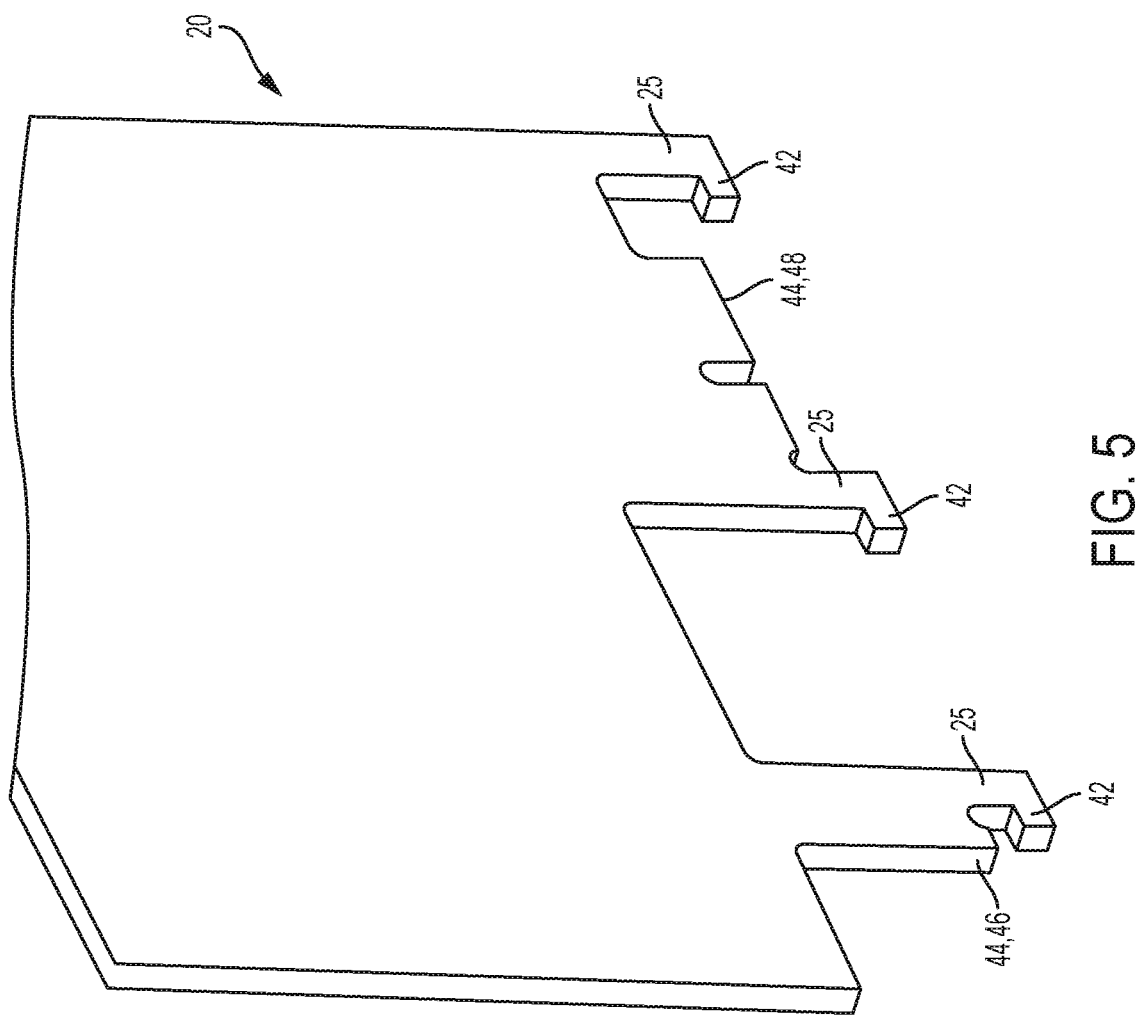
FIG. 5: A perspective view of an embodiment of a substantially rigid member having three protrusions, each protrusion comprising a lower jut or an upper jut.

As a further option, to prevent the substantially rigid member 20 from sliding along the support member 10, the substantially rigid member 20 may comprise a protrusion 25 having a lower jut 42 and a contact surface 44 that contacts the support surface 12 of the support member 10. The contact surface 44 may be an upper jut 46 on the protrusion 25, such as those shown in FIG. 5. The contact surface 44 may also be another structure 48 on the substantially rigid member 20. For example, the edge of the substantially rigid member 20 may itself contact the support surface 10, or the edge may have another structure 48 that extends downward to contact the support surface 12. Regardless of the precise structure for the contact surface 44, the lower jut 42 and the contact surface 44 are located so that the vertical distance between the lower jut 42 and the contact surface 44 is approximately equal to the thickness of the support member 10. As a result, when the substantially rigid member 20 is connected to the support member 10 and slid until the lower jut 42 overlaps the bottom surface 14, both the lower jut 42 and the contact surface 44 are in contact with the support member 10. Due to this contact, there is a friction force between the lower jut 42 and the bottom surface 14 and a friction force between the contract surface 44 and the support surface 12. Because of these two friction forces, the substantially rigid member 20 resists sliding that would re-align the lower jut 42 with the slot 15 and allow withdrawal of the protrusion 25.

Figure 10:
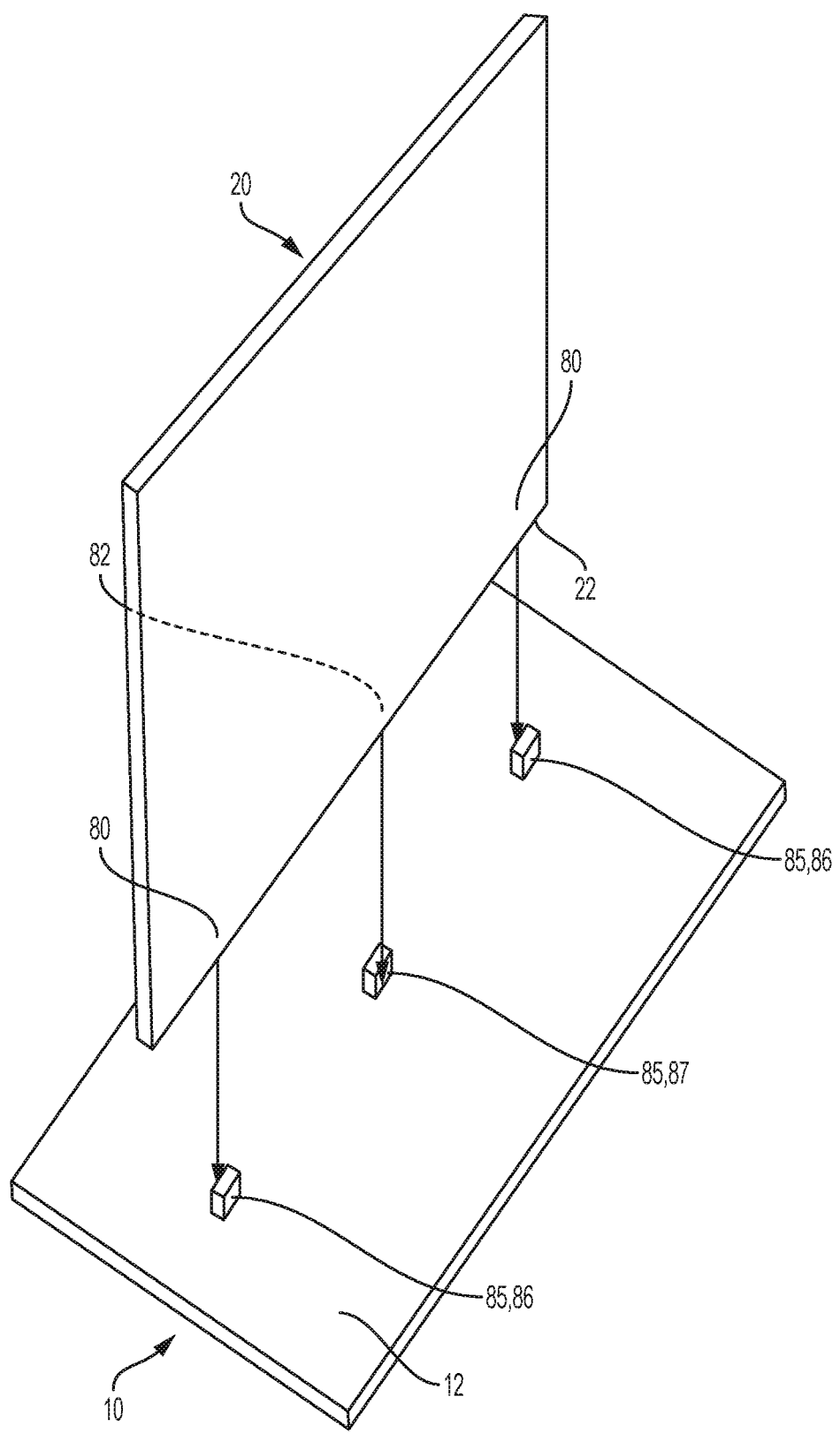
FIG. 10: An exploded view of an alternative embodiment of the printed circuit board assembly comprising three protrusions on the support member, the arrows indicating how the substantially rigid member may be inserted between the protrusions.
Figure 11:
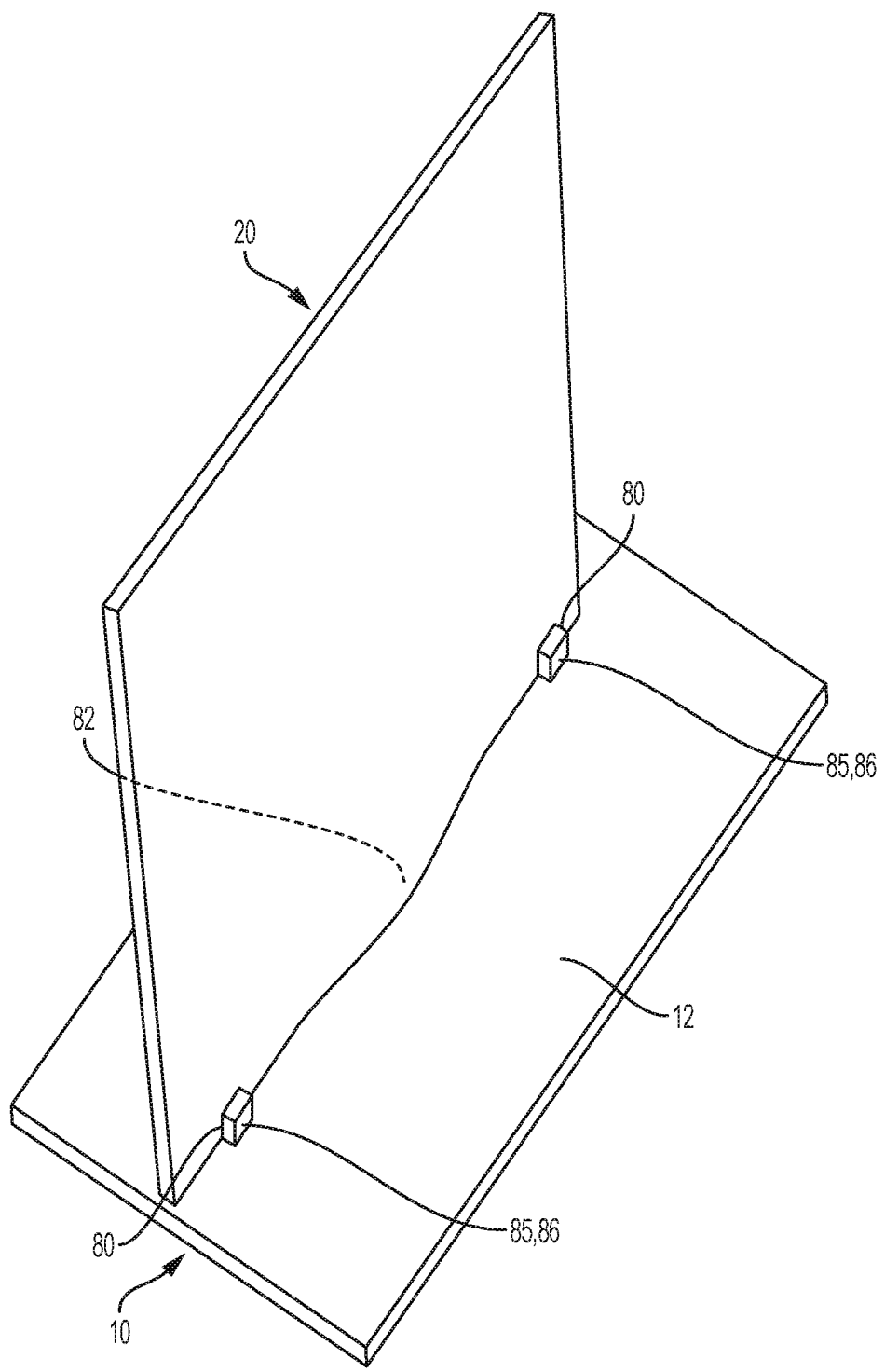
FIG. 11: A perspective view of an alternative embodiment of the printed circuit board assembly wherein the substantially rigid member is inserted between at least three protrusions on the support member.

In yet another embodiment, the substantially rigid member 20 is connected to the support member 10 by inserting an edge 22 of the substantially rigid member 20 between at least three protrusions 85 located on the support member 10. In this embodiment, the substantially rigid member 20 has a contact edge 22, the contact edge 22 being the portions of the substantially rigid member 20 that contact the support member 10 when the members are connected. In the accompanying drawings, such as FIGS. 10 and 11, the contact edge 22 is generally the bottom edge of the substantially rigid member 20. The contact edge 22 is not necessarily a straight edge and may comprise various structures. For instance, in embodiments with three protrusions 85, the contact edge 22 may comprise three structures that extend downward and interface with the protrusions 85 on the support member 10. The contact edge 22 may have any suitable curve. In some embodiments, where the substantially rigid member 20 is a flat board, the contact edge 22 is straight, but in other embodiments, the contact edge 22 may be circular, semi-circular or some other shape depending on the overall shape of the substantially rigid member 20.

The contact edge 22 has two sides, which are ordinarily the opposing large, flat surfaces of the substantially rigid member 20. The first side of the contact edge 22 has at least two contact points 80 where protrusions 85 contact the substantially rigid member 20, and the second side has at least one contact point 82 where a protrusion 85 contacts the substantially rigid member 20. In some embodiments, one or more of the contact points 80, 82 are plated with metal or another conductive material to facilitate an electrical connection between the substantially rigid member 20 and the support member 10.

The support member 10 comprises at least three protrusions 85 on its support surface 12. The protrusions 85 are arranged in a configuration that substantially complements the curve of the contact edge 22 of the substantially rigid member 20. When the substantially rigid member 20 is connected to the support member 10, each protrusion 85 contacts the substantially rigid member 20 at one of the contact points 80, 82 on the contact edge 22. The protrusions 85 may generally have any suitable shape. In some embodiments, the protrusions 85 comprise at least one flat surface, which contacts the corresponding contact point 80, 82 on the substantially rigid member 20. The protrusions 85 may also be circular, ovular, D-shaped, or any other suitable shape. In some embodiments, the protrusions 85 are plated with metal or another conductive material to facilitate an electrical connection between the substantially rigid member 20 and the support member 10.

The protrusions 85 are arranged so that the substantially rigid member 20 cannot be inserted between the protrusions 85 without flexing the substantially rigid member 20. In general, the three protrusions 85 are configured so that two end protrusions 86 are on one side of the substantially rigid member 20 and one middle protrusion 87 is on the other side of the substantially rigid member 20. Additional protrusions 85 may be used in some embodiments, and these embodiments will ordinarily have two protrusions 86 on one side of the substantially rigid member 20 and at least one protrusion 87 between those two protrusions 86 on the opposite side of the substantially rigid member 20. The protrusions 85 are therefore arranged to substantially complement the curve of the contact edge 22 but to require at least some flexing before the substantially rigid member 20 can be inserted. Similar to the previously discussed embodiments, the flex of the substantially rigid member 20 around the protrusions 85 provides opposing forces that maintain the substantially rigid member 20 upright relative to the support member 10 and that allow the substantially rigid member 20 to resist disconnection from the support member 10.

The exact configuration of the protrusions 85 will vary based on a variety of factors. In some embodiments where the substantially rigid member 20 is a flat board, such as the embodiment shown in FIGS. 10 and 11, the protrusions 85 may be in a straight line if the substantially rigid member 20 can be sufficiently flexed around the middle protrusion 87. In other embodiments, however, one of the protrusions 87 may be offset from the other protrusions 86 such that the substantially rigid member 20 has to be flexed more or less before it can be inserted between the protrusions 85. For instance, in embodiments where the substantially rigid member 20 is longer or more flexible, an offset that requires more flexing of the substantially rigid member 20 may be desirable because more flex may provide more force that will more readily hold the substantially rigid member 20 in place. Alternatively, in embodiments where the substantially rigid member 20 is shorter or more rigid, the protrusions 85 may be arranged to decrease the amount of flex required to insert the substantially rigid member 20 between the protrusions 85.

In embodiments where one or more of the protrusions 85 and contact points 80, 82 are plated, the electrical connection between the members 10, 20 is maintained by the opposing forces on the protrusions 85 due to the flex of the substantially rigid member 20. For a protrusion 85 with an electrical connection, the force that the contact point 80, 82 applies against the protrusion 85 causes the conductive or semi-conductive material on the protrusion 85 to maintain contact with the conductive or semi-conductive material on the contact point 80, 82. In some embodiments, more than one protrusion 85 electrically connects to a contact point 80, 82, and in some of those embodiments, all protrusions 85 electrically connect to a contact point 80, 82.

Although the foregoing description of the printed circuit board assembly has focused on the support member and the substantially rigid member, one of ordinary skill will understand that the assembly may comprise numerous other structures. For instance, a plurality of substantially rigid members may be connected to the support member. Alternatively, the substantially rigid member may also be a second support member, to which another substantially rigid member connects. In addition, other electrical or non-electrical components may be connected to the support member or the substantially rigid member.

Yet another embodiment of the invention comprises a method of assembling two objects, one of which is a substantially rigid member 20 and the other of which is a support member 10. One, both, or neither of the members 10, 20 may be a printed circuit board. The members 10, 20 have either one of the protrusion-slot configurations or the protrusion-contact-edge configuration discussed in the embodiments above. The method of assembly comprises flexing the substantially rigid member 20 to align, depending on the embodiment, either its protrusions with the slots or its contact edge with the protrusions. In embodiments with slots, the protrusions are then inserted into the respective slots. In embodiments with a contact edge, the contact edge is then inserted between the protrusions.

Optionally, in embodiments where the substantially rigid member 20 includes at least one lower jut, the method also comprises sliding the substantially rigid member 20 along the support member 10 until the lower jut overlaps the bottom surface of the support member 10. Once slid, the substantially rigid member 20 resists disconnection from the support member 10. Further, in some embodiments, the protrusion-slot configuration or protrusion-contact-edge configuration electrically connects the members 10, 20. In those embodiments, the electrical connection may be reinforced, for instance by soldering. But in other embodiments, the protrusion-slot or protrusion-contact-edge connection only mechanically, but not electrically connects the members 10, 20.

In addition to anything described above or currently claimed, the following list is embodiments that are specifically contemplated, may be claimed, and supported by the specification:

Embodiment 1 is a printed circuit board assembly comprising: a substantially rigid member, the substantially rigid member having a first protrusion, a second protrusion, and a third protrusion; a support member, the support member having a first slot, a second slot, and a third slot, wherein the slots are configured so that the first slot is aligned with the first protrusion, the second slot is aligned with the second protrusion, and the third slot is offset from the third protrusion in a direction perpendicular to the curve formed by the first, second, and third protrusion; wherein at least one of the substantially rigid member and the support member is a printed circuit board, and wherein the substantially rigid member experiences flex when the protrusions are inserted into the slots.

Embodiment 2 is a printed circuit board assembly comprising: a substantially rigid member, the substantially rigid member having a first protrusion; a support member, the support member having a first slot; and a fastener connecting the substantially rigid member to the support member, wherein at least one of the substantially rigid member and the support member is a printed circuit board, and wherein the substantially rigid member experiences flex when the fastener is secured and the first protrusion is inserted into the first slot. Embodiment 3 is Embodiment 2, wherein the fastener is a second protrusion on the substantially rigid member inserted into a second slot on the support member, wherein the first slot has a shape complementary to the shape of the first protrusion and the second slot has a shape complementary to the shape of the second protrusion, wherein one of the slots has an orientation that is rotated less than 90° relative to the orientation of the respective protrusion. Embodiment 4 is Embodiment 2, wherein the fastener is a screw. Embodiment 5 is Embodiment 2, wherein the fastener is solder.

Embodiment 6 is any one of Embodiments 1-5, wherein at least one of the protrusions comprises a lower jut below the support member. Embodiment 7 is Embodiment 6, wherein the substantially rigid member comprises a contact surface above the support member, wherein the distance between the lower jut and the contact surface is approximately equal to the thickness of the support member. Embodiment 8 is Embodiment 7, wherein the contact surface is an upper jut of one of the protrusions.

Embodiment 9 is any one of Embodiments 1-8, wherein the substantially rigid member is secured to the support member by only a plurality of protrusions on the substantially rigid member inserted into a plurality of slots on the support member.

Embodiment 10 is a method of assembling a printed circuit board assembly, the method comprising: providing the printed circuit board assembly from any one of Embodiments 1-9; flexing the substantially rigid member to align each protrusion with each respective slot; and inserting each protrusion into each respective slot. Embodiment 11 is Embodiment 10, wherein the printed circuit board assembly is any one of Embodiments 6-9, the method further comprising: sliding, after inserting each protrusion, the substantially rigid member along the support member until the lower jut overlaps the bottom surface of the support member. Embodiment 12 is any one of Embodiment 10 or 11, the method further comprising applying solder to at least one of the protrusions inserted into one of the slots.

Embodiment 13 is a printed circuit board assembly comprising: a substantially rigid member, the substantially rigid member having a contact edge, the contact edge having a first side with a first contact point and a second contact point and a second side with a third contact point; a support member, the support member having a first protrusion, a second protrusion, and a third protrusion, wherein the protrusions are configured to substantially coincide with the contour of the contact edge; wherein at least one of the substantially rigid member and the support member is a printed circuit board, and wherein the substantially rigid member experiences flex when the contact edge is inserted between the protrusions such that the first protrusion contacts the first contact point, the second protrusion contacts the second contact point, and the third protrusion contacts the third contact point.

Embodiment 14 is Embodiment 13, wherein the substantially rigid member is secured to the support member by only the contact edge of the substantially rigid member inserted between a plurality of protrusions on the support member.

Embodiment 15 is a method of assembling a printed circuit board assembly, the method comprising: providing the printed circuit board assembly of any one of Embodiments 13 or 14; flexing the substantially rigid member; and inserting the contact edge between the protrusions.

Embodiment 16 is any one of Embodiments 1-15, wherein both the substantially rigid member and the support member are printed circuit boards. Embodiment 17 is any one of Embodiments 1-15, wherein one of the substantially rigid member and the support member is printed circuit board and the other is an electrical circuit component. Embodiment 18 is Embodiment 17, wherein the electrical circuit component is an antenna.

Embodiment 19 is any one of Embodiments 1-18, wherein at least one electronic component is assembled on the printed circuit board. Embodiment 20 is Embodiment 19, wherein the at least one electronic component is an antenna.

Embodiment 21 is any one of Embodiments 1-20, wherein at least one of the protrusions electrically connects the substantially rigid member to the support member. Embodiment 22 is Embodiment 21, wherein at least two of the protrusions electrically connect the substantially rigid member to the support member. Embodiment 23 is Embodiment 22, wherein each protrusion electrically connects the substantially rigid member to the support member.

It is to be understood that any given elements of the disclosed embodiments may be embodied in a single structure, a single step, a single substance, or the like. Similarly, a given element of a disclosed embodiment may be embodied in multiple structures, steps, substances, or the like.

The foregoing description illustrates and describes the processes, machines, manufactures, compositions of matter, and other teachings of the present disclosure. Additionally, the disclosure shows and describes only certain embodiments of the processes, machines, manufactures, compositions of matter, and other teachings disclosed, but, as mentioned above, it is to be understood that the teachings of the present disclosure are capable of use in various other combinations, modifications, and environments and are capable of changes or modifications within the scope of the teachings as expressed herein, commensurate with the skill and/or knowledge of a person having ordinary skill in the relevant art. The embodiments described hereinabove are further intended to explain certain best modes known of practicing the processes, machines, manufactures, compositions of matter, and other teachings of the present disclosure and to enable others skilled in the art to utilize the teachings of the present disclosure in such, or other, embodiments and with the various modifications required by the particular applications or uses. Accordingly, the processes, machines, manufactures, compositions of matter, and other teachings of the present disclosure are not intended to limit the exact embodiments and examples disclosed herein. Any section headings herein are provided only for consistency with the suggestions of 37 C.F.R. § 1.77 or otherwise to provide organizational queues. These headings shall not limit or characterize the invention(s) set forth herein.

We claim:

1. A method of assembling a printed circuit board assembly, the method comprising:
   (a) providing a printed circuit board assembly comprising:
      i. a unitary substantially rigid member, the unitary substantially rigid member having a first protrusion, a second protrusion, and a third protrusion, each projecting from a common edge; and
      ii. a support member, the support member having a first slot, a second slot, and a third slot, wherein the slots are configured so that the first slot is aligned with the first protrusion, the second slot is aligned with the second protrusion, and the third slot is offset from the third protrusion in a direction perpendicular to a curve formed by the first, second, and third protrusions,
      wherein at least one of the unitary substantially rigid member and the support member is a printed circuit board, and wherein the unitary substantially rigid member experiences flex when the protrusions are inserted into the slots;
   (b) flexing the unitary substantially rigid member to form the curve and to align each protrusion with each respective slot; and
   (c) inserting each protrusion into each respective slot.

2. The method of claim 1, the method further comprising applying solder to at least one of the protrusions inserted into one of the slots.

3. The method of claim 1, wherein both the unitary substantially rigid member and the support member are printed circuit boards.

4. The method of claim 1, wherein one of the unitary substantially rigid member and the support member is printed circuit board and the other is an electrical circuit component.

5. The method of claim 4, wherein the electrical circuit component is an antenna.

6. The method of claim 1, wherein at least one electronic component is assembled on the printed circuit board.

7. The method of claim 6, wherein the at least one electronic component is an antenna.

8. The method of claim 1, wherein at least one of the protrusions electrically connect the unitary substantially rigid member to the support member.

9. The method of claim 1, wherein at least two of the protrusions electrically connect the unitary substantially rigid member to the support member.

10. The method of claim 1, wherein each protrusion electrically connects the unitary substantially rigid member to the support member.

11. The method of claim 1, wherein at least one of the protrusions comprises a lower jut below the support member.

12. The method of claim 11, wherein the unitary substantially rigid member comprises a contact surface above the support member, wherein the vertical distance between the lower jut and the contact surface is approximately equal to the thickness of the support member.

13. The method of claim 12, wherein the contact surface is an upper jut of one of the protrusions.

14. The method of claim 11, comprising sliding the unitary substantially rigid member along the support member until the lower jut overlaps the bottom surface of the support member.

15. The method of claim 1, wherein the unitary substantially rigid member is secured to the support member by only the protrusions on the unitary substantially rigid member inserted into the slots on the support member.

* * * * *